United States Patent [19]

Henneberger et al.

[11] Patent Number: 4,628,527
[45] Date of Patent: Dec. 9, 1986

[54] MINI HEARING AID

[75] Inventors: Hans Henneberger, Effeltrich; Walter Puchta, Erlangen, both of Fed. Rep. of Germany

[73] Assignee: Siemens Aktiengesellschaft, Berlin and Munich, Fed. Rep. of Germany

[21] Appl. No.: 548,798

[22] Filed: Nov. 4, 1983

[30] Foreign Application Priority Data

Dec. 6, 1982 [DE] Fed. Rep. of Germany ....... 3245030

[51] Int. Cl.$^4$ ........................ H04R 25/02; H05G 1/04
[52] U.S. Cl. .................................. 381/69.2; 381/68.7; 361/401
[58] Field of Search .................... 361/401; 381/68, 69; 179/107 R, 107 H, 107 G

[56] References Cited

U.S. PATENT DOCUMENTS

| | | | |
|---|---|---|---|
| 2,495,546 | 1/1950 | Posen | 361/401 |
| 2,959,645 | 11/1960 | Ladd | 361/401 |
| 2,990,498 | 6/1961 | Evans | 361/401 |
| 3,049,647 | 8/1962 | Lincoln | 361/401 |
| 3,702,953 | 11/1972 | Fauth | 361/401 |
| 4,054,938 | 10/1977 | Morris | 361/401 |

FOREIGN PATENT DOCUMENTS

| | | |
|---|---|---|
| 1139549 | 11/1962 | Fed. Rep. of Germany . |
| 2242337 | 4/1973 | Fed. Rep. of Germany ...... 361/401 |
| 7831808 | 4/1980 | Fed. Rep. of Germany . |
| 2271740 | 12/1975 | France . |
| 573745 | 3/1958 | Italy .................................. 361/401 |
| 1198449 | 7/1970 | United Kingdom . |
| 2000336 | 1/1979 | United Kingdom . |

Primary Examiner—Gene Z. Rubinson
Assistant Examiner—L. C. Schroeder
Attorney, Agent, or Firm—John Francis Moran

[57] ABSTRACT

A miniature hearing aid (1) includes a microphone (12), a receiver (14) an amplifier (15), and a battery connectable via a contact (18), all of which are contained in a housing (2,3). The amplifier is constructed of a printed circuit board (20) and a plurality of components (21). In order to save space, the components (21) are countersunk in openings (24) in the circuit board (20) to reduce the vertical dimension of the amplifier. The openings (24) are used as temporary supports and for exact positioning for the components (21) by making them rectangular with cut off edges.

7 Claims, 4 Drawing Figures 4,628,527

MINI HEARING AID

BACKGROUND OF THE INVENTION

The present invention relates to a small sized (hereinafter called "miniature" or "mini") hearing aid.

More particularly, the invention relates to a miniature hearing aid having a microphone, an amplifier, a battery and a receiver, all contained in a housing.

Miniature hearing aids, especially those worn on the users head—for example, worn in or behind the ear or built into spectacle frames—have an extremely limited space for installation of the required mechanical and electrical components. Therefore, constant efforts have been directed to installing the individual components required for the conversion and amplification of sound in a most favorable and space saving manner.

A mini hearing aid of the type to which the present invention relates is disclosed in the German Utility Model Patent No. GM 7,831,808. This patent discloses a compact housing in which are packaged a microphone, an amplifier, a battery and a receiver. The electrical components of this hearing aid (transistors, resistors, capacitors, etc.), are disposed on facing sides of two printed circuit boards, arranged in parallel within the hearing aid housing. With such a packaging concept, the thickness of the circuit boards had a direct bearing on the size of the housing so that it is desirable to reduce the thickness of these circuit boards. However, too much of a reduction in the thickness of these boards leads to problems of stability and reliability. The German Patent Publication (DAS) No. 1,139,549 discloses a behind-the-ear hearing air in which the thickness of the printed circuit boards is eliminated as a factor in the external dimensions of the hearing aid. In this device, openings or recesses are provided in the circuit board into which the electrical components are countersunk. As a result, it is the thickness of the electrical components alone, rather than the thickness of these components plus the thickness of the circuit board, which determines the total constructional width of the amplifier.

With this type of circuit construction, special measures must be taken to clamp the circuit components within the recesses of the circuit board. It is known, for example from the aforementioned DAS No. 1,139,549, to provide a mechanical strap to hold the component in place. As an alternative, the British Pat. No. 1,198,449 discloses an assembly of electrical circuit components wherein the components are held in place within recesses of a circuit board either by forcing them into wedge shaped slots or by surrounding them with a small quantity of electrically insulating silicone rubber or wax.

These previously known techniques for clamping electrical components in recesses in a circuit board have certain disadvantages. The provision of a separate strap is, of course, expensive in that it requires an extra part to be manufactured and assembled. Furthermore, such a strap adds to the external dimensions of the circuit assembly. The utilization of silicone rubber, wax or some other bonding compound also adds to the cost of manufacture. The provision of wedge shaped sides in a circuit board recess is the least expensive of the clamping techniques; however, this technique can be utilized only when the component itself is tapered, cylindrical or otherwise adapted and shaped to the wedge shaped slot.

SUMMARY OF THE INVENTION

An object of the present invention is to provide a circuit assembly for a mini hearing aid which has a minimum width dimension.

A further object of the present invention is to provide a circuit assembly comprising a printed circuit board and a plurality of circuit components in which the thickness of the circuit board is eliminated as a factor in the width dimension of the assembly.

A further object of the present invention is to provide a circuit assembly having a circuit board which is provided with openings for insertion of circuit components.

It is a further object of the present invention to provide a circuit assembly comprising a circuit board and a plurality of components arranged within openings in this circuit board in which the components are mechanically supported within these openings.

The above objects, as well as other objects which will become apparent from the discussion that follows, are achieved, according to the present invention, by providing a miniature hearing aid including a microphone, an amplifier, a battery and a receiver all contained in a housing, wherein the amplifier comprises a number of electric circuit components and a circuit board having openings adapted to receive the components. In order to secure a component in an opening, the opening is formed in the shape of a rectangle having at least one corner cut off at a 45° angle. This configuration provides the additional advantage of compensating for size tolerances of the components to be inserted. This is because the corners of the components may contact different points along the slanted edges of the openings if variations occur in the lengths of the components' sides. Although such compensation is best achieved if two corners at opposite ends of one size of an opening are cut off, this effect is achievable even if only one corner of the rectangular shaped opening is cut off.

A further advantage of the openings with cut off corners according to the invention is that they make possible a certain degree of "centering" of the components so that the points of electrical connection of the components and the circuit board may be aligned. In this way, the correct insertion and alignment of the components in the circuit boards does not require any concentrated effort or attention on the part of the assembler. This is particularly true when the openings are provided with two cut off corners as indicated above. In this case, the center line of a rectangular shaped component which is inserted in a circuit board will be substantially aligned with the center line of the opening.

For a full understanding of the present invention, reference should now be made to the following detailed description of one preferred embodiment of the invention and to the accompanying drawings.

DESCRIPTION OF THE PREFERRED EMBODIMENTS

Figure 1:
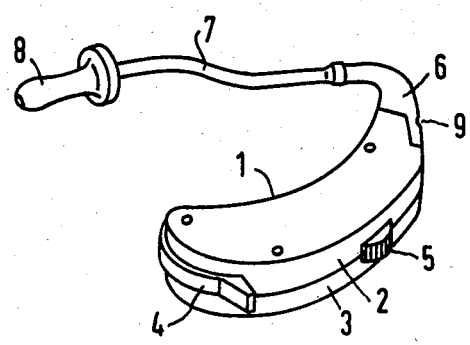
FIG. 1 is a perspective view of a hearing aid designed to be worn behind the ear.

The preferred embodiments of the present invention will now be described with reference to FIGS. 1-4 of the drawing.

FIG. 1 shows a miniature hearing aid designed to be worn behind the ear. As may be seen, the individual components of the device are located in a housing comprised of an upper shell 2 and a lower shell 3. Two components—namely, holder 4 and an amplifier regulator 5—partially protrude from the housing. In order to wear the device behind the ear, the housing has an angle piece 6 attached to one end which encases a sound tube connected via a tube 7 to an ear olive 8. The external sound reaches the hearing aid microphone through a receiving opening 9 located in the angle piece 6.

Figure 2:
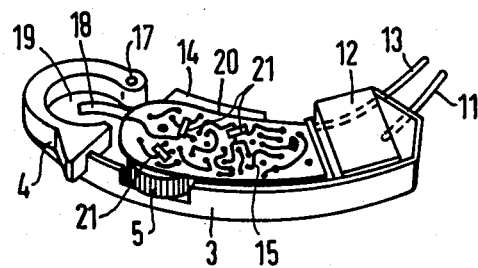
FIG. 2 is a perspective view, on an enlarged scale, of the lower shell of the hearing aid illustrated in FIG. 1, into which the components of the hearing aid are positioned.
Figure 3:
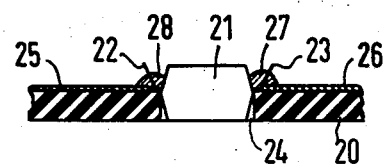
FIG. 3 is a cross-sectional view of a portion of the amplifier circuit board, in greatly enlarged scale, with a component inserted in an opening therein.

As shown in FIG. 2, the sound entering the opening 9 is passed to the microphone 12 by means of a sound tube 11. Another sound tube 13 from a receiver (sound transducer) 14 leads to the tube located in the angle piece 6 and eventually to the sound tube 7. Between the battery holder 4 and the microphone 12 lies the amplifier assembly 15 which is supplied with current from the battery. The battery holder 4 is arranged to swivel about an axis 17. When the holder is in the position shown, the battery located in the space 19 comes in contact with the contact element 18. By swivelling the holder 4 in or out about the axis 17, the connection with the contact element 18 is made or broken, thereby activating or deactivating the device. The amplifier assembly includes a printed circuit board 20 and components 21 positioned on or within it. Referring to FIG. 3, the center of a component 21, from which protrude connecting leads 22 and 23, exhibits a conical shape at its edges, as indicated by the wedge-shaped form extending outward on both sides. As a result, the component 21 is wedged in position even though the board 20 has straight vertical walls in its opening 24. The connecting leads 22 and 23 are clamped within the opening 24 and soldered to the printed circuit conductors 25 and 26, as indicated by the soldering material 27 and 28. The connecting leads thus prevent the component 21 from passing through the opening 24.

Figure 4:
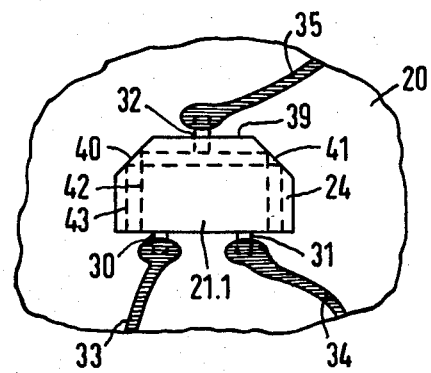
FIG. 4 is a top view of a portion of the amplifier circuit board, in greatly enlarged scale, having a rectangular opening for insertion of a component, with the corners of the opening at the ends of one long side thereof cut off at 45° angles.

FIG. 4 shows the printed circuit board in top view with a rectangular shaped opening 24 for insertion of a component. In accordance with the invention, two corners 40 and 41 at opposite ends of the long side 39 of the rectangle have been cut off at 45° angles. Upon insertion of a component 21.1, which in this instance is a transistor with three terminals 30, 31 and 32, its upper corners contact the facets (slanted walls) of the cut off edges 40 and 41. This contact serves not only to hold the component in place, but also to center the component so that its terminals 30, 31 and 32 line up with the respective printed circuit conductors 33, 34 and 35. After the component 21.1 is inserted, these respective terminals and conductors are soldered together.

The formation of the opening 24 in the shape of a rectangle with at least one cut off corner, as is illustrated in FIG. 4, assures that the component will always be supported, notwithstanding variations in the lateral dimensions of the component. The dashed lines 42 and 43 indicate possible cross-sections of the component 21.1. As may be seen, the points of contact between the component and the cut off edges 40 and 41 of the opening 24 are displaced; nevertheless, the component 21.1 is securely supported within the opening and its terminals are aligned with the printed circuit conductors.

There has thus been shown and described a novel hearing aid apparatus which fulfills all the objects and advantages sought therefor. Any changes, modifications, variations, and other uses and applications of the subject invention will, however, become apparent to those skilled in the art after considering this specification and the accompanying drawings which disclose preferred embodiments thereof. All such changes, modifications, variations and other uses and applications which do not depart from the spirit and scope of the invention are deemed to be covered by the invention which is limited only by the claims which follow.

What is claimed is:

1. A miniature hearing aid including a microphone, an amplifier, a battery and a receiver all contained in a housing, wherein said amplifier comprises a plurality of electrical circuit components and a circuit board having a plurality of openings adapted to receive said components; the improvement comprising at least one opening in said circuit board adapted for receiving a component and is in a generally rectangular shape wherein at least one corner portion of the opening is modified by a diagonal intersecting edge forming a cut-off and the openings adapted to receive a rectangular component inserted in the opening while the diagonal intersecting edge bears against a corner of the rectangular component to secure the rectangular component to the opening.

2. The hearing aid defined in claim 1, wherein two corners at opposite ends of one long side of the opening rectangle have been cut off.

3. The hearing aid defined in claim 1, wherein the opening edge at the cut off corner is slanted at an angle of 45° with respect to the two adjacent perpendicular edges of the opening rectangle.

4. The hearing aid defined in claim 2, wherein the two opening edges at the cut off corners are slanted at an angle of 45° with respect to their two adjacent perpendicular edges of the opening rectangle.

5. The hearing aid defined in claim 1 wherein said component has at least one projection protruding from its side, thereby to prevent said component from passing through said opening.

6. The hearing aid defined in claim 5, wherein said at least one projection is a connecting lead.

7. A miniature hearing aid including a microphone, an amplifier, a battery and a receiver all contained in a housing, wherein said amplifier comprises a plurality of electrical circuit components and a circuit board having a plurality of openings adapted to receive said components; at least one of the openings in said circuit board having a generally rectangular shape and at least one corner region of the opening including a diagonal segment extending from one side of the opening to an adjoining side forming a cutoff corner, and at least one component having a predetermined generally rectangular shape which fits into the opening and is mechanically secured therein by friction fit between one corner of the component and the diagonal segment wherein the corner of the component associated with the diagonal segment contacts it at a point related to the component size to secure mechanically within the one opening and the one component has a major dimension along an axis of an orientation that corresponds to the orientation of one of the dimensions of the opening.

* * * * *